United States Patent [19]

Ogura

[11] Patent Number: 4,500,204
[45] Date of Patent: Feb. 19, 1985

[54] SCANNING-TYPE LITHOGRAPHIC AND IMAGE-PICKUP DEVICE USING OPTICAL FIBER

[75] Inventor: Mutsuo Ogura, Ibaraki, Japan

[73] Assignees: Agency of Industrial Science & Technology; Ministry of International Trade & Industry, both of Tokyo, Japan

[21] Appl. No.: 364,911

[22] Filed: Apr. 2, 1982

[30] Foreign Application Priority Data

Apr. 21, 1981 [JP] Japan .................. 56-61018
Apr. 21, 1981 [JP] Japan .................. 56-61019

[51] Int. Cl.$^3$ .................. G01N 21/63
[52] U.S. Cl. .................. 356/318; 250/227; 250/458.1; 350/96.26
[58] Field of Search .............. 250/458.1, 459.1, 461.1, 250/461.2, 227; 356/417, 317, 318, 300; 350/6.1, 6.2, 96.26, 523

[56] References Cited

U.S. PATENT DOCUMENTS

| | | | |
|---|---|---|---|
| 3,494,354 | 2/1970 | Yokota et al. | 350/96.26 X |
| 3,942,866 | 3/1976 | Roman | 350/96.26 |
| 3,953,730 | 4/1976 | Henry et al. | 250/227 |
| 4,418,390 | 11/1983 | Smith et al. | 358/80 X |

*Primary Examiner*—F. L. Evans
*Attorney, Agent, or Firm*—Schwartz & Weinrieb

[57] ABSTRACT

A scanning-type lithographic and image-pickup device causes the terminal face of either a projecting optical fiber or a picking-up optical fiber to scan a given object in the plane of real image of an objective lens, projects a light through the projecting optical fiber onto the object, and receives the reflected light or a light of photoluminescence through the picking-up optical fiber. When this device is applied to a spectromicroscope, the quantitative surface information can be spectrally measured with high resolution and high reproducibility. When the device is applied to a contracting-projection exposure device or a selective laser annealing device, positional alignment and exposure pattern correction can be easily effected with high accuracy and high productivity. Simultaneous fabrication of a plurality of electronic components can be also obtained by use of this device.

26 Claims, 16 Drawing Figures

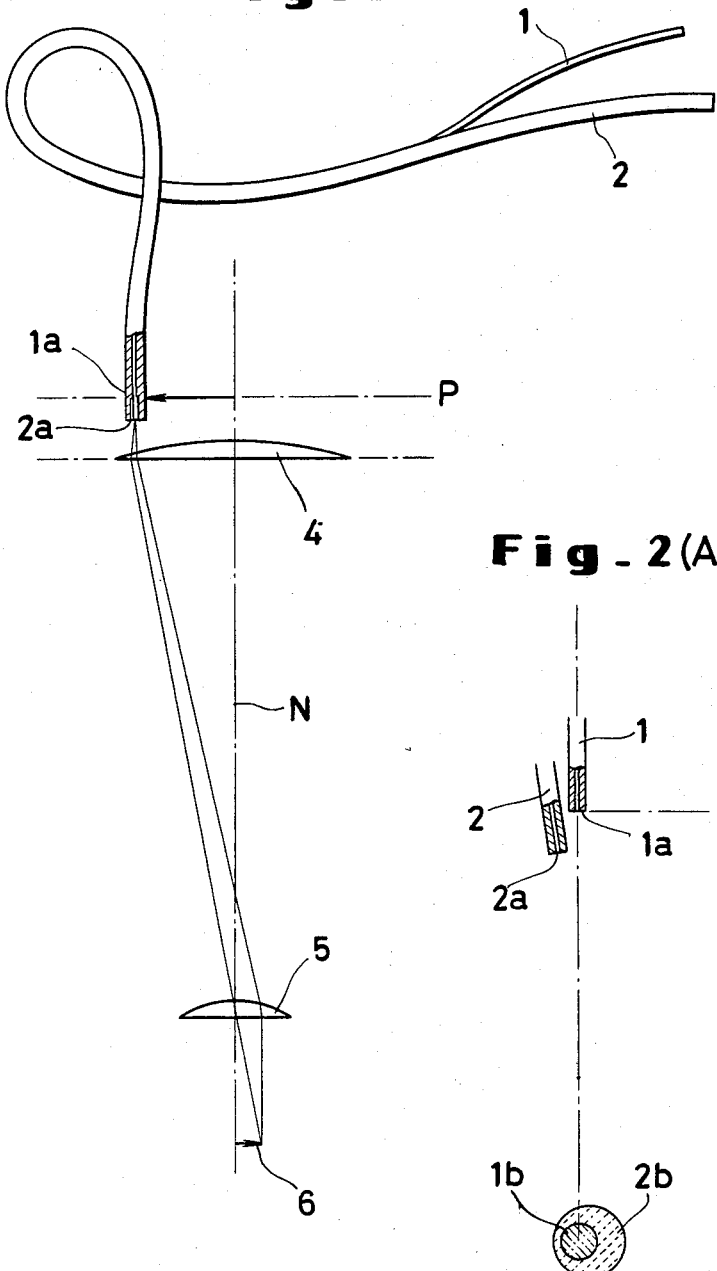
Fig_1
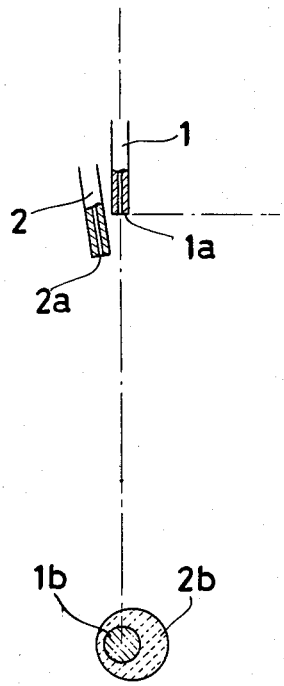
Fig_2(A)
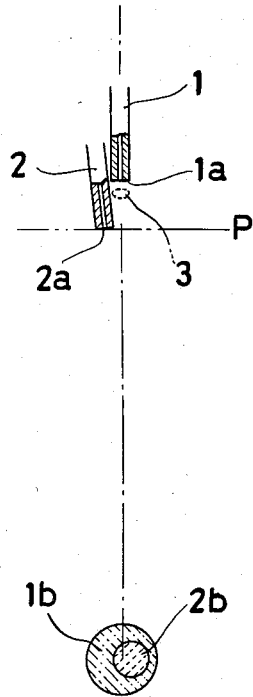
Fig_2(B)

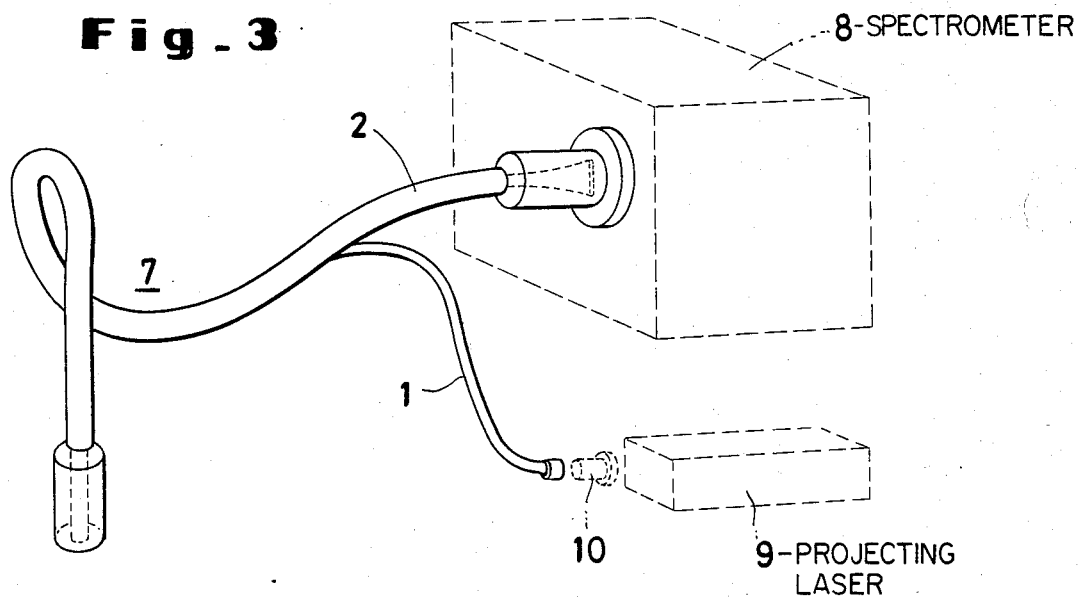
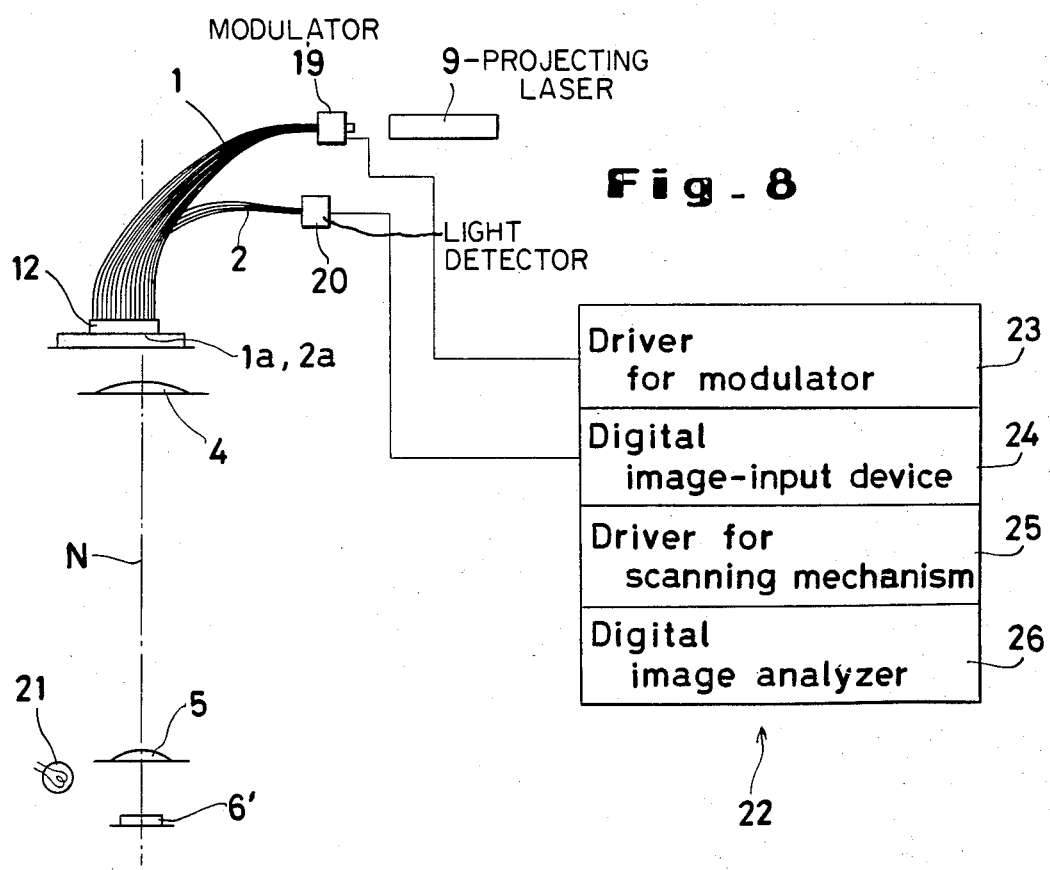

SCANNING-TYPE LITHOGRAPHIC AND IMAGE-PICKUP DEVICE USING OPTICAL FIBER

FIELD OF THE INVENTION:

This invention relates to a scanning-type lithographic and image-pickup device for projecting and condensing images of extremely minute regions of a given object with high resolution through an optical system by means of the scanning motion of a projecting and a condensing optical fiber, and more particularly to a scanning-type lithographic and image-pickup device which is utilized as in a spectromicroscope, a contracting-projection exposure device, or a selective laser annealing device so as to produce quantitative surface information and images with high resolution.

BACKGROUND OF THE INVENTION

To realize microscopic miniaturization of electronic devices, improvement in accuracy and quality of the techniques used for the measurement and fabrication of extremely fine regions of semiconductor elements is an indispensable requirement. With a view to improving the productivity of electronic devices and the freedom of design thereof, the formation of a required pattern on a semiconductor material has been effected by a method which involves application of a photo-mask to the surface of the material or a method which involves direct irradiation of the surface of the material with electron beams. The optical lithographic method, which is simpler in both mechanical construction and operational procedure than the aforementioned method using photo mask or electron beams, should find acceptance.

Generally, as means for reading optical information from extremely minute regions of a given object by scanning, there have been developed a flying-spot scanner which utilizes the light-emitting surface of a CRT, a drum scanner which uses a rotary drum, and a laser microscope. As devices for forming a given image of extremely fine details on the surface of a minute substrate, there have been developed and accepted for actual use a laser trimming device and a laser-processing device, for example.

The methods of scanning adopted in these devices may be broadly classified into a type resorting to mechanical driving of stages on which objects being scanned are mounted, a type wherein the position of light sources are changed with the aid of movable mirrors, and a type utilizing the light-emitting surface of a CRT.

The method which mechanically scans the object has the disadvantage that the inertia, vibration and other similar impacts produced while the object being scanned and the device serving to retain intact the environment of the object are in motion during the mechanical scanning can directly result in the degradation of the resolution and the reproducibility of measurement. With this method, therefore, it has been difficult to obtain desired measurement and fabrication at extremely low temperatures and high vacuum which necessitate adoption of particularly complicated devices for the maintenance of environment.

To preclude the disadvantage due to the inertia, vibration, and other impacts produced in the mechanical elements, there has been proposed a technique which makes use of optical fibers of small inertial mass (British Pat. No. 1,124,805). In the conventional scanning mechanism which utilizes optical fibers, however, the loci of the movement of the fiber tips fall in a spherical surface, the relative position of fibers to the object lens varies, and the fibers produce a nonlinear movement involving different rates of speed in the central portion and in the peripheral portion. By this reason, such optical fibers are not well suited for use in devices used for the measurement and fabrication of semiconductor element materials which call for accuracy of much higher level. They are totally unsuitable for spectromicroscopes, exposure devices, and other similar devices which require high resolution and high quantitative accuracy.

In the method which effects the scanning with laser beams by means of movable mirrors, perfect alignment of one optical system for projection with one for image-pickup calls for use of half mirrors. Thus, the efficiency of image-pickup is inevitably lowered. Moreover, the complicated optical configuration consisting of a laser unit, half mirrors, movable mirrors, mirrors for the guidance of laser beams, and the like, requires additional adjustment. This method has proved disadvantageous in terms of maintenance and operation.

The method which utilizes the light-emitting surface of a CRT has the disadvantage that the light source has a lower intensity than the laser unit and the light emitted is not easily focused. This method, therefore, has found limited applications.

OBJECT OF THE INVENTION

An object of this invention is to provide a scanning-type lithographic and image-pickup device which, owing to simplification of both the picking-up and projecting optical systems and a decrease in the degree of fabricating accuracy required of the scanning mechanism, involves no appreciable physical restrictions even under special conditions, enables measurements to be effected with high reproducibility of image-pickup efficiency and high resolution, produces quantitative surface information, enjoys ease of handling such as in positioning and focusing, and contributes to elevation of the performance of the spectromicroscope, contracting-projection exposure device, laser annealing device, laser-processing device, and the like.

SUMMARY OF THE INVENTION

To accomplish the object described above according to the present invention, there is provided a scanning-type lithographic and image-pickup device which comprises at least one projecting optical fiber, at least one picking-up optical fiber, a scanning mechanism serving to cause the tips of the projecting and picking-up optical fibers to produce a scanning motion, and an optical system serving to guide the projected light from the projecting optical fiber to a given object and allow the reflected light from the object to be led through the same light path to the picking-up optical fiber. Depending on the nature of an operation to be involved, either the projecting optical fiber or the picking-up optical fiber is positioned on the plane of real image of the optical system.

The projecting and picking-up optical fibers are integrally joined to each other, the terminal face of either of the optical fibers is placed in the plane of real image of the optical system, and the terminal face of the other optical fiber is positioned before or behind the plane of real image. Owing to this disposition of the optical fibers, the light projected from the projecting optical fiber is reflected by the surface of the object and returned through the same light path to the terminal portion of the projecting optical fiber. Since the flux of the beams of light has been diffused en route, the returned beams of light are partly collected in the picking-up optical fiber. The image-pickup gain in this case can be increased by having a plurality of picking-up optical fibers disposed so as to encircle the projecting optical fiber. The device of this invention enjoys optical stability because it has no need for such means as half mirrors which are essential components for the conventional lithographic and image-pickup devices. Since the mechanical scanning by use of the optical fiber is effected on the plane of real image of the objective lens, the mechanical error attendant upon scanning is lessened in proportion to the number of magnifications of the objective lens. The device of this invention, accordingly, is enabled to effect the required measurement and processing with high resolution and high reproducibility.

In the laser exposure device and processing device, the positional alignment of the object being scanned affects the accuracy of processing to a great extent. With the device of this invention, the shape of the object can be measured without any positional deviation when the scanning with the projecting and picking-up optical fibers is effected by use of stable light of low energy. On the basis of the results of this measurement, the pattern of the image to be formed can be altered with the aid of an electronic computer. Suitable application of the device of this invention can lead to materialization of a contracting-projection exposure device, a laser annealing device, a laser processing device, etc. which do not require positional alignment to be made by the mechanical driving of stages supporting objects.

BRIEF DESCRIPTION OF THE DRAWINGS

The other objects and characteristics of the present invention will become apparent from the further disclosure of the invention to be made hereinbelow with reference to the accompanying drawings, wherein:

FIG. 1 is an explanatory diagram schematically illustrating the construction of the scanning-type lithographic and image-pickup device of the present invention.

FIGS. 2A and 2B are schematic explanatory diagrams illustrating the effect of the positional relationship of the projecting and picking-up optical fibers with reference to the plane of real image.

FIG. 3 is a perspective view illustrating the construction of the optical fibers in one embodiment of the present invention.

FIG. 8 is a schematic diagram of the construction in which the device of this invention is applied to a contracting-projection exposure device or a selective laser annealing device.

DESCRIPTION OF THE PREFERRED EMBODIMENT

Figure 2C:
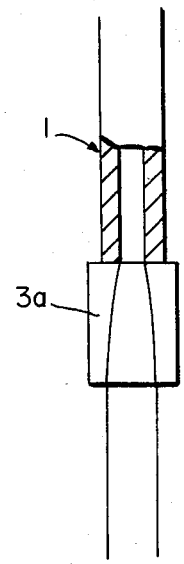
FIGS. 2C-2E are schematic explanatory diagrams illustrating the use of a self-focus lens or a microlens, in conjunction with the injecting terminal of the projecting optical fiber, or the fabrication of the injecting terminal of the projecting optical fiber so as to have a hemispherical configuration, respectively.

This invention relates to a scanning-type lithographic and image-pickup device which enables a given object to be measured with high resolution or to be fabricated with high accuracy by causing the tip of either the projecting optical fiber or the picking-up optical fiber to produce a scanning motion on the plane of real image of the objective lens in the optical system.

FIG. 1 is to illustrate the construction and operating principle of the scanning-type lithographic and image-pickup device of the present invention. In the diagram, 1 denotes a projecting optical fiber, 1a a projecting terminal, 2 a picking-up optical fiber, 2a an injecting terminal, 4 a polarizing lens, 5 an objective lens, 6 an object, and P the plane of real image.

The light from a light source (not shown) is projected through the projecting terminal 1a, passed through the condensing lens 4, convergently projected by the objective lens 5, and focused in a microscopically minute region of the surface of the object 6. The diameter of the flux of beams of light focused on the object 6 is the quotient of the division of the diameter of the projecting optical fiber 1 by the number of magnifications of the objective lens 5 as the divisor. The reflected light produced on the surface of the object 6 or the light of the photoluminescence of the object itself is condensed by the objective lens 5, injected through the injecting terminal 2a of the picking-up optical fiber 2 disposed in front of the plane P of real image, and led to a spectrometer 8, for example, when the device of this invention is applied to a spectromicroscope as illustrated in FIG. 3. The focal point of the condensing lens 4 is fixed at the pupillary point of the objective lens 5. The two-dimensional information is collected by passing the optical fibers over the object in a scanning manner in the directions of the X-axis and Y-axis either manually or by means of a scanning mechanism such as an ordinary XY-stage provided with a step motor, with the optical medial line of the objective lens 5 serving as the axis.

Figure 4:
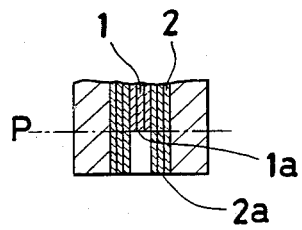
FIGS. 4A and 4B are an enlarged view and a partially sectioned view respectively of the terminal face of the optical fiber cable of FIG. 3.
Figure 4:
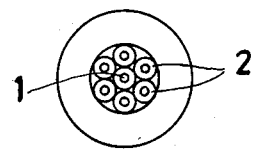

In FIGS. 2A and 2B which illustrate the positional relationship of the picking-up optical fiber and the projecting optical fiber, the range of excitation on the surface of the object corresponding to the projecting terminal 1a of the projecting optical fiber 1 is denoted by 1b and the range of detection on the surface of the object corresponding to the injecting terminal 2a of the picking-up optical fiber 2 is denoted by 2b. FIG. 2A represents a case in which the projecting terminal 1a of the projecting optical fiber 1 is set in the plane P of real image of the objective lens and the injecting terminal 2a of the picking-up optical fiber 2 is deviated from the plane P of real image. In this arrangement of the optical fibers, the range 1b of excitation of the projecting optical fiber condensed to the fullest possible extent is included in part of the range 2b of detection of the picking-up optical fiber. In this arrangement, the light-pickup efficiency of the device can be enhanced by increasing the number of picking-up optical fibers as illustrated in FIG. 4, for example.

Figure 2D:
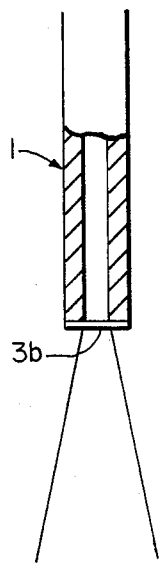
Figure 2E:
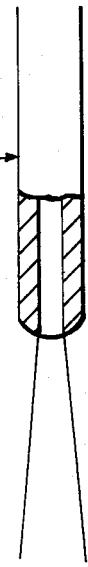

FIG. 2B represents a case in which the injecting terminal 2a of the picking-up optical fiber is positioned in the plane P of real image of the objective lens and the projecting terminal 1a of the projecting fiber is deviated from the plane P of real image. In this arrangement, the range 2b of detection of the picking-up optical fiber focused to the fullest possible extent is included in part of the range 1b of excitation of the projecting optical fiber. In this case, the projecting angle of beams can be decreased and the projected light can be consequently increased by either providing a picking-up lens such as a self-focus lens 3a as illustrated in FIG. 2C or a microlens 3b as illustrated in FIG. 2D in front of the injecting terminal 1a of the projecting optical fiber or cutting the injecting terminal 1a in the shape of a hemisphere as illustrated in FIG. 2E and imparting thereto a lens effect. Although the injecting terminal 1a of the projecting optical fiber 1 is positioned behind the plane P of real image, the same effect is obtained by positioning the injecting terminal 1a in front of the plane P of real image instead. For practical purpose, the selection between the two positions mentioned above is left to the discretion of the person working the present invention. However, since chromatic aberration is produced when a single lens is used for lights of different colors, the plane of real image relative to light of long wavelength is positioned behind the plane of real image relative to light of short wavelength. It is, therefore, desirable to have an optical fiber for light of short wavelength positioned in front of an optical fiber for light of long wavelength.

FIG. 3 represents a case in which the scanning-type lithographic and image-pickup device of the present invention is applied to a spectromicroscope. The number of projecting optical fibers 1 and that of picking-up optical fibers 2 can be selected in accordance with the wavelength to be used and the unit area of the regions to be scanned. In the present embodiment, a total of seven low-loss quartz fibers having a core diameter of 80 $\mu$m and a clad diameter of 125 $\mu$m are used, one for the projecting optical fiber and six for the picking-up optical fibers, respectively. These quartz fibers are collectively joined as one seven-core optical fiber cable 7 of high mechanical strength. This cable is extended and connected to a spectrometer 8 and a projecting laser 9 which are separated by several meters to several hundred meters from each other.

FIGS. 4A and 4B illustrate the terminal portion of the seven-core optical fiber cable 7 of FIG. 3 to be used for coupling with to a microscope. The projecting terminal 1a of the projecting optical fiber 1 is positioned in the plane P of real image of the objective lens 5 in order that the light for excitation may be condensed to the fullest possible extent. The injecting terminals 2a of the picking-up optical fibers 2 are positioned in front of the plane of real image to encircle the projecting optical fiber 1. In this arrangement, the pickup efficiency of the device can be enhanced by increasing the number of picking-up optical fibers 2.

Figure 5:
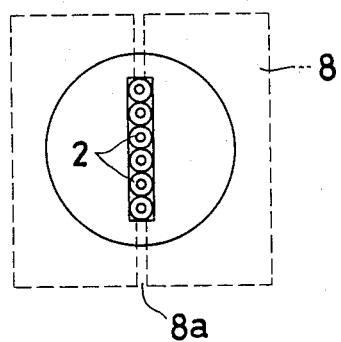
FIG. 5 is a view of the terminal face of the picking-up optical fiber for connection with the mechanical part.

FIG. 5 illustrates the terminal faces of the picking-up optical fibers 2 for connection to a spectrometer 8. In this case, the coupling efficiency to the spectrometer 8 can be improved by arranging the terminal faces in a row along the injection slit 8a of the spectrometer 8.

Figure 6:
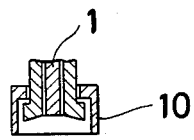
FIGS. 6A and 6B are an enlarged view and a partially sectioned view respectively of the light source side terminal face of the projecting optical fiber.
Figure 6:
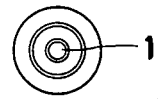

FIGS. 6A and 6B are an enlarged view and a partially sectioned view respectively of the light source side terminal face of the projecting optical fiber 1. To the light source side terminal face of the projecting optical fiber 1 is connected a connector 10 which is intended to permit ready interchange of light sources to suit particular requirements of the experiments involved.

In the embodiment described above, the distribution of surface information of a given light-emitting body can be detected by using the picking-up optical fibers 2 alone. A two-dimensional optical probe for X- and Y-axes can be formed by using the projecting optical fiber 1 alone.

Figure 7:
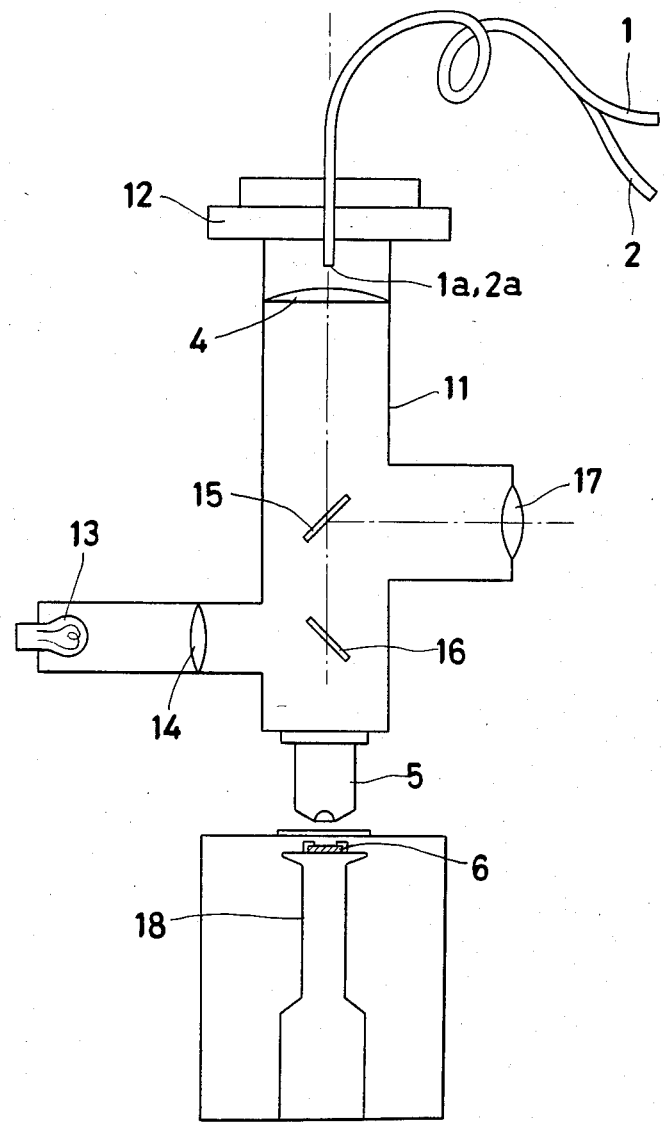
FIG. 7 is a schematic diagram of the construction of one embodiment of this invention for a spectro-microscope.

FIG. 7 is a structural diagram specifically illustrating a typical application of the scanning-type lithographic and image-pickup device of this invention to a spectromicroscope. In this application, the device is utilized for the purpose of photoluminescence at extremely low temperatures. In the diagram, the same numerical symbols as those found in FIG. 1 denote identical component parts, 11 denotes the spectromicroscope, 12 an XY-stage as a typical example of a scanning mechanism, 13 an illuminating light source, 14 a condensing lens, 15 and 16 removable half mirrors, the former for observation and the latter for illumination, 17 an eye lens, and 18 a special environment retaining device such as a cooling device for use at extremely low temperatures, a heating device for use at highly elevated temperatures, or a vacuumizing device.

In this embodiment, since the spectromicroscope 11 incorporates a projecting optical fiber and a picking-up optical fiber 2, the user can observe a light excited region of the object as a luminescent spot in the microscopic image with his unaided eye. After the point of measurement has been confirmed, the loss of the quantity of light can be precluded by removing the half mirrors 15 and 16 from the light path in the spectromicroscope 11. The scanning of the point of measurement can be accomplished by driving the optical fibers 1 and 2 either manually or by means of a powered XY-stage 12, for example.

By the spectromicroscope constructed as described above, the two-dimensional distribution of optical and electronic properties of a given semiconductor material can be measured with resolution on the order of 1 $\mu$m at temperatures in the range of several degrees Kelvin to some hundreds of degrees Kelvin, for example. To be specific, the two-dimensional image of the property of the semiconductor material reflecting the distribution of crystalline defects can be obtained with high resolution through the measurement of photoluminescence, spectrum at extremely low temperatures or light excited transient of electronic impedance. With the spectromicroscope utilizing the device of the present invention, the electrooptic nature of crystal dislocation and the condition of segretation of contained impurities in the semiconductor material, which are crystallographically valuable information, can be observed. It also clarifies the problem of the hetrogeneity of semiconductor material which has become important with recent large-scale integration of semiconductor devices and helps to elucidate the cause for crystalline defects.

Figure 9A:
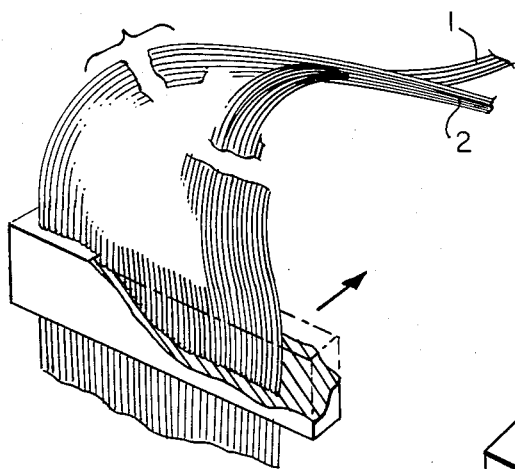
FIGS. 9A and 9B are schematic explanatory diagrams illustrating the disposition of the multiplicity of the terminal faces of the projecting and picking-up optical fibers in a linear or matrix format, respectively.
Figure 9B:
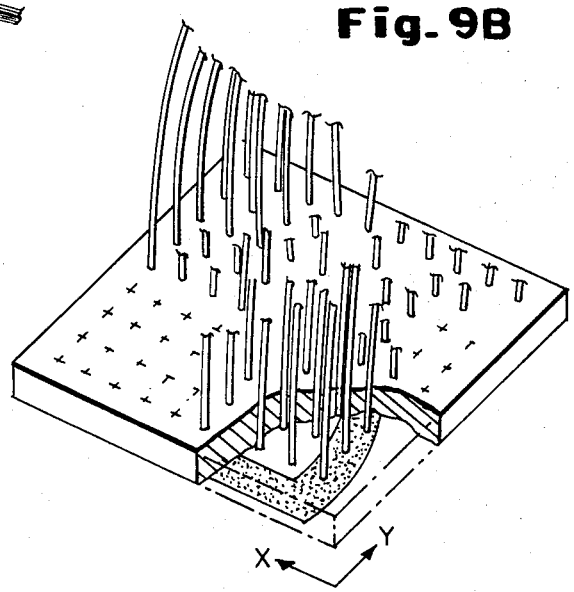

In the present embodiment, if a short-wave laser provided with an output modulator and a large-output pulse laser are used as light sources, the XY-stage is adapted to be operated by a power-driven mechanism, and the driving of the XY-stage is controlled by use of an electronic computer, then the device of this invention can be used as a contracting-projection exposure device or as a selective laser annealing device which requires only minimal alignment by the movement of the stage holding an object FIG. 8 represents a structural diagram illustrating one application of the device of this invention to a contracting-projection exposure device and a laser annealing device using optical fibers. The terminal faces of the projecting and picking-up optical fibers denoted respectively by 1a and 2a are arranged in the form of an n×n matrix as illustrated in FIG. 9B or a 1×n line as illustrated in FIG. 9A. By 9 is denoted a laser as a light source, which is a HeCd short-wave laser for photoresist exposure or a NdYAG pulse laser for the laser annealing device. The other components are a modulator 19 for the projected laser beam, a light detector 20, a safe-light illuminator 21 and a controlling minicomputor 22 which is composed of a driver 23 for light modulator, a digital image-input device 24, a driver 25 for scanning mechanism, and a digital image analyzer 26.

In this embodiment, by either injecting a long-wave low-power laser beam into the projecting optical fiber 1 or driving the XY-scanner 12 under the illumination of the safe-light illuminating device 21, the device of this invention is enabled to detect the light from the picking-up optical fiber by the light detector 20, determine the shape and the disposition of the object by the digital image-input device 24, and produce an exposure pattern of corrected position and shape by the digital image analyzer 26. Then, by driving the light modulator 23 and, at the same time, driving the XY-scanner 12 thereby moving the luminescent spots projected through the terminal faces 1a of the projecting optical fibers in conformity with the exposure pattern produced on the computer memory, one exposure pattern is irradiated by one-axis scanning where the terminal faces 1a are arranged in the form of a straight line as illustrated in FIG. 9A or so many exposure patterns as will correspond to the terminal faces arranged in the optical fiber matrix are irradiated by two-axis scanning where the terminal faces 1a are arranged in the form of a matrix as illustrated in FIG. 9B, respectively on the semiconductor wafer 6'. With the scanning-type lithographic and image-pickup device of the present invention, the heretofore inevitable use of the exposure mask can be dispensed with and the correction in the image pattern can be effected by means of a computer program. Thus, the accuracy otherwise essential for the mechanical alignment of the stage carrying thereon the object is not required. The device permits easy correction of the exposure pattern to suit the work in process and, therefore, promises to make a notable contribution to increased yield. By use of a number of projecting optical fibers, the device of this invention further permits construction of a contracting-projection exposure device or a selective laser annealing device which has the advantage of enabling a multiplicity of electronic devices to be manufactured simultaneously.

As described above, the present invention provides a scanning-type lithographic and image-pickup device which greatly simplifies the optical system for scanning and enables the scanning operation to be effected with high accuracy and stability owing to use of optical fibers and permits quantitative measurement of surface information with the resolution and reproducibility approaching the limits of the optical system or formation of a desired pattern on a substrate with high accuracy while precluding the deviation of the position of irradiation and obviating the necessity for accurate alignment of optical axis owing to the immobilization of the objective lens and the object being scanned. Further, the scanning-type lithographic and image-pickup device of this invention can easily be applied, without requiring any appreciable alteration of design, to such machines as a spectromicroscope, contracting-projection exposure device, and selective laser annealing device, which are required to use a scanning system of reliable performance and high accuracy.

Obviously, many modifications and variations of the present invention are possible in light of the above teachings. It is therefore to be understood that within the scope of the appended claims, the present invention may be practiced otherwise than as specifically described herein.

What is claimed is:

1. A scanning-type lithographic and image-pickup device, comprising at least one projecting optical fiber, at least one picking-up optical fiber, a scanning mechanism for causing the terminal portions of said projecting and picking-up optical fibers to produce a scanning motion, and an optical system for guiding the light projected from said projecting optical fiber to the surface of a given object and then guiding the light reflected on said surface through the same light path into said picking-up optical fiber, either of said projecting optical fiber and picking-up optical fiber being positioned in the plane of real image of said optical system and the other optical fiber being positioned in front of or behind the plane of real image.

2. A scanning-type lithographic and image-pickup device according to claim 1, wherein at least one projecting optical fiber is positioned in the plane of real image and at least one picking-up optical fiber is positioned in front of or behind the plane of real image.

3. A scanning-type lithographic and image-pickup device according to claim 2 wherein the surface of incidence of light of the picking-up optical fiber is disposed in front of the plane of real image.

4. A scanning-type lithographic and image-pickup device according to claim 2, wherein the surface of incidence of light of the picking-up optical fiber is disposed behind the plane of real image.

5. A scanning-type lithographic and image-pickup device according to any of claims 2 to 4, wherein a plurality of projecting optical fibers are used and are disposed in the form of a matrix.

6. A scanning-type lithographic and image-pickup device according to any of claims 2 to 4, wherein a plurality of projecting optical fibers are used and are arranged in the form of a straight line.

7. A scanning-type lithographic and image-pickup device according to any of claims 2 to 4, wherein a plurality of picking-up optical fibers are used and are disposed so as to encircle said projecting optical fiber.

8. A scanning-type lithographic and image-pickup device according to any of claims 2 to 4, wherein a plurality of picking-up optical fibers are disposed in front of the plane of real image.

9. A scanning-type lithographic and image-pickup device according to any of claims 2 to 4, wherein a plurality of picking-up optical fibers are disposed behind the plane of real image.

10. A scanning-type lithographic and image-pickup device according to claim 1, wherein at least one picking-up optical fiber is positioned in the plane of real image and at least one projecting optical fiber is positioned in front or behind the plane of real image.

11. A scanning-type lithographic and image-pickup device according to claim 10, wherein a plurality of picking-up optical fibers are used and are disposed so as to encircle said projecting optical fiber.

12. A scanning-type lithographic and image-pickup device according to claim 10, wherein at least one projecting optical fiber is positioned in front of the plane of real image.

13. A scanning-type lithographic and image-pickup device according to claim 1, wherein at least one projecting optical fiber is positioned in front of the plane of real image.

14. A scanning-type lithographic and image-pickup device according to claim 10, wherein at least one projecting optical fiber is positioned behind the plane of real image.

15. A scanning-type lithographic and image-pickup device according to claim 11, wherein at least one projecting optical fiber is positioned behind the plane of real image.

16. A scanning-type lithographic and image-pickup device according to any one of claims 1 or 12 to 15, wherein a microlens is attached to the tip of said projecting optical fiber.

17. A scanning-type lithographic and image-pickup device according to any one of claims 1 or 12 to 15, wherein a self-focus lens is attached to the tip of the projecting optical fiber.

18. A scanning-type lithographic and image-pickup device according to any one of claims 1 or 12 to 15, wherein the leading end of the projecting optical fiber is formed in the shape of a hemisphere.

19. A scanning-type lithographic and image-pickup device according to claim 8, wherein at least one projecting optical fiber and a plurality of picking-up optical fibers are integrally formed and the terminals thereof provided with a scanning mechanism are connected to an optical microscope and the other terminals connected to a spectrometer.

20. A scanning-type lithographic and image-pickup device according to claim 19, wherein at the terminals connected to the optical microscope, a plurality of picking-up optical fibers are arranged to encircle a projecting optical fiber and, at the other terminals, the plurality of picking-up optical fibers are disposed in one straight line.

21. A scanning-type lithographic and image-pickup device according to claim 1, wherein a plurality of projecting optical fibers and picking-up optical fibers are disposed in the form of a matrix and the terminals thereof on one side are attached to said scanning mechanism, the other terminals of said projecting optical fibers are connected through a light modulator to a light source and the other terminals of said picking-up optical fibers are connected to a light detector.

22. A scanning-type lithographic and image-pickup device according to claim 1, wherein a plurality of projecting optical fibers and picking-up optical fibers are disposed in a straight line and the terminals thereof on one side are attached to said scanning mechanism, the other terminals of said projecting optical fibers are connected via a light modulator to a light source and the other terminals of the picking-up optical fibers are connected to a light detector.

23. A scanning-type lithographic and image-pickup device according to claim 21 or 22, wherein said device is a contracting-projection exposure device.

24. A scanning-type lithographic and image-pickup device according to claim 21 or 22, wherein said device is selective laser annealing device.

25. A scanning-type lithographic and image-pickup device according to claim 9, wherein:
at least one projecting optical fiber and a plurality of picking-up optical fibers are integrally formed and the terminals thereof provided with a scanning mechanism are connected to an optical microscope and the other terminals connected to a spectrometer.

26. A scanning-type lithographic and image-pickup device according to claim 25, wherein:
at the terminals connected to the optical microscope, a plurality of picking-up optical fibers are arranged to encircle a projecting optical fiber and, at the other terminals, the plurality of picking-up optical fibers re disposed in one straight line.

* * * * *